(12) United States Patent
Shastri et al.

(10) Patent No.: US 7,589,392 B2
(45) Date of Patent: Sep. 15, 2009

(54) FILTER HAVING INTEGRATED FLOATING CAPACITOR AND TRANSIENT VOLTAGE SUPPRESSION STRUCTURE AND METHOD OF MANUFACTURE

(75) Inventors: Sudhama Shastri, Phoenix, AZ (US); Ryan Hurley, Gilbert, AZ (US); David Heminger, Phoenix, AZ (US); Yenting Wen, Chandler, AZ (US); Mark A. Thomas, Negri Sembilan (MY)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 244 days.

(21) Appl. No.: 11/454,682

(22) Filed: Jun. 16, 2006

(65) Prior Publication Data

US 2007/0290297 A1 Dec. 20, 2007

(51) Int. Cl.
  *H01L 27/10* (2006.01)
(52) U.S. Cl. .............................. 257/532; 257/E27.048; 257/531
(58) Field of Classification Search .................. 257/531, 257/532, 535, E27.048
  See application file for complete search history.

(56) References Cited

U.S. PATENT DOCUMENTS

| | | | | |
|---|---|---|---|---|
| 3,671,793 | A * | 6/1972 | Scarlett | 257/773 |
| 4,211,941 | A * | 7/1980 | Schade, Jr. | 327/565 |
| 4,633,291 | A * | 12/1986 | Koyama | 257/532 |
| 5,018,000 | A * | 5/1991 | Yamada et al. | 257/532 |
| 6,362,012 | B1 * | 3/2002 | Chi et al. | 438/3 |
| 6,538,300 | B1 * | 3/2003 | Goldberger et al. | 257/532 |
| 6,861,926 | B1 | 3/2005 | Wang et al. | |
| 6,953,980 | B2 | 10/2005 | Escoffier et al. | |
| 2003/0228848 | A1 * | 12/2003 | Escoffier et al. | 455/91 |

OTHER PUBLICATIONS

Article "EMI Filters in Wireless Applications", by Fabien Franc published in Electronic Products Supplement, Spring 2002, pp. 1-2, http://electronicproducts.com.

Data Sheet, "LCD & Camera EMI Filter Array with ESD Protection", Preliminary CM1450, California Micro Devices, 2005 pp. 1-8, www.calmicro.com.

Data Sheet, "LCD & Camera EMI Filter Array with ESD Protection", Preliminary CM14151, California Micro Devices, 2005 pp. 1-8, www.calmicro.com.

Data Sheet, "5$^{th}$-Order, Lowpass, Elliptic, Switched-Capacitor Filters" MAX7408/MAX7411/MAX7412/MAX7415, Maxim Integrated Products, 19-1378, Rev 1: Oct. 1998, pp. 1-12, http://www.maxin-ic.com.

(Continued)

*Primary Examiner*—Lex Malsawma
*Assistant Examiner*—Robert Huber
(74) *Attorney, Agent, or Firm*—Kevin B. Jackson

(57) ABSTRACT

In one embodiment, a filter structure that integrates one plate of a capacitor with an electrode of a transient voltage device. The filter structure includes a well region of one conductivity type formed in semiconductor substrate of an opposite conductivity type. The well region forms one plate of the capacitor and an electrode of the transient voltage suppression device. A dielectric layer is formed over a portion of the well region and a conductive layer is formed overlying the dielectric layer to provide a second plate of the capacitor. The dopant concentration of the well region provides a constant capacitance/voltage characteristic for the filter structure when a selected voltage range is applied to plates of the capacitor.

6 Claims, 10 Drawing Sheets

OTHER PUBLICATIONS

Data Sheet, STF202-22 "USB Filter with ESD Protection", Publication Order No. STF202-22T1/D, Jul. 2002-Rev. 6, pp. 1-8, www.onsemi.com.

Data Sheet, NUF6106FCT1 "6 Channel EMI Pi-Filter Array with ESD Protection", Publication Order No. NUF6106FC/D, Mar. 2004-Rev.0, pp. 1-4, www.onsemi.com.

Data Sheet, NUF2101M "USB Filter with ESD Protection", Publication Order No. NUF2101M/D, Aug. 2005-Rev. 1, pp. 1-4, www.onsemi.com.

"Integrated Multilayer RF Passives in Silicon Technology", by Joachim N. Burghartz, pp. 141-147, published by IEEE, 1998, 0-7803-5288-2/98/$10.00.

"Future Package Technologies for Wireless Communication Systems" by Telesphor Komgaing, et al., Intel Corporation 2005, pp. 353-364, http://developer.intel.com.

USPTO Office Action for Case U.S. Appl. No. 11/454,682, by Sudhama Shastri et al; Mailed Jun. 17, 2008.

* cited by examiner

FILTER HAVING INTEGRATED FLOATING CAPACITOR AND TRANSIENT VOLTAGE SUPPRESSION STRUCTURE AND METHOD OF MANUFACTURE

FIELD OF THE INVENTION

This invention relates generally to electronic devices, and more specifically to semiconductor device structures and methods of their manufacture.

BACKGROUND OF THE INVENTION

Electronic filters are used today to suppress noise, reject unwanted signals, or in some way manipulate the characteristics of an input signal. Typical semiconductor based filter design comprise inductor, resistor and/or capacitor networks. Such networks are often placed together with separate transient voltage suppression (TVS) devices such as Zener diodes on a single chip to provide ESD protection in addition to signal processing. The capacitance contribution of the TVS device often is used to further shape the filter characteristic.

An elliptic or Cauer filter is one type of filter design that utilizes inductors and capacitors. Elliptic filters are desired in certain applications such as electromagnetic interference (EMI) or Universal Serial Bus (USB) filter applications, because they have equal ripple in both the pass band and stop band, a sharp cut-off characteristic, a relatively low group delay for its band-stop characteristics, and excellent stop band attenuation compared to other classic filter designs such as Chebyshev filters.

One challenge semiconductor based filter designers face is providing an effective design in as small a space as possible in order to meet the size requirements that some applications demand. This challenge is often difficult, particularly when the filter design includes inductor and capacitor structures together with TVS devices.

Accordingly, a structure and method of manufacture are needed that improve the integration of passive components with TVS devices in order to meet the challenges described above as well as others.

For simplicity and clarity of illustration, elements in the figures are not necessarily to scale, and the same reference numbers in different figures denote the same elements. Additionally, descriptions and details of well-known steps and elements are omitted for simplicity of the description. As used herein, current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-channel devices, a person of ordinary skill in the art will appreciate that complementary devices are also possible in accordance with the present invention. For clarity of the drawings, doped regions of device structures are illustrated as having generally straight line edges and precise angular corners. However, those skilled in the art understand that due to the diffusion and activation of dopants the edges of doped regions are generally not straight lines and the corners are not precise angles.

DETAILED DESCRIPTION OF THE DRAWINGS

Figure 1:
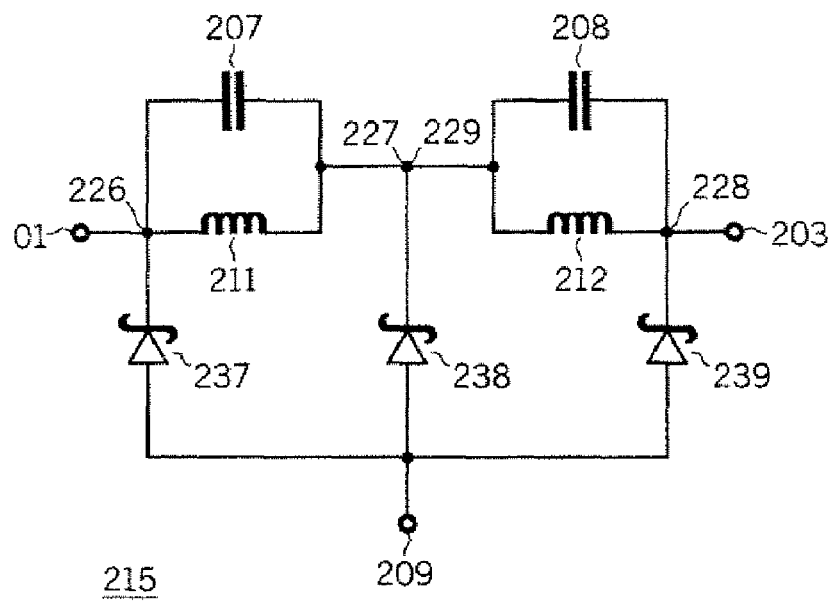
FIG. 1 illustrates a schematic of a prior art elliptic filter circuit.

FIG. 1 schematically illustrates a prior art embodiment of a circuit that represents an elliptic filter structure 215 having an input 201 and an output 203. Filter 215 includes an inductor 211 coupled in parallel with a linear capacitor 207 to form a first resonant circuit. An inductor 212 is coupled in parallel with a linear capacitor 208 to form a second resonant circuit. A first TVS device 237 is connected between a first terminal 226 of inductor 211 and a common return terminal 209. A second TVS device 238 is connected between terminal 209 and a common connection to a second terminal 227 of inductor 211 and a first terminal 229 of inductor 212. A third TVS device 239 is connected between a second terminal 228 of inductor 12 and terminal 209.

Figure 2:
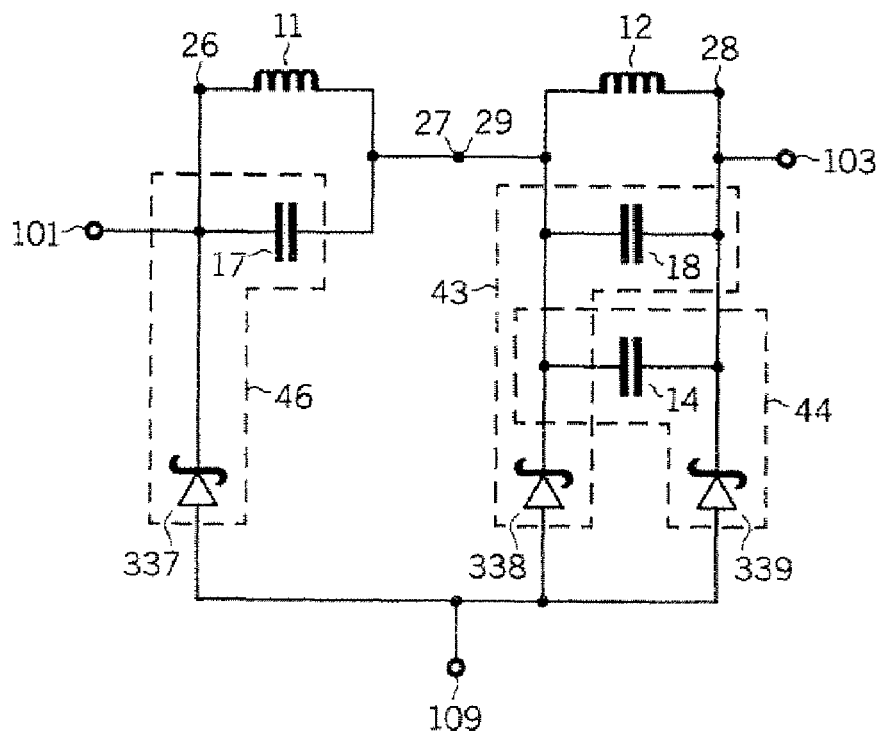
FIG. 2 illustrates a schematic of a filter circuit in accordance with an embodiment of the present invention.

FIG. 2 schematically illustrates an embodiment of a circuit that represents an elliptic filter structure 15 in accordance with an embodiment of the present invention with an input 101 and an output 103. Structure 15 includes an inductor 11 coupled in parallel with a floating capacitor 17 to form a first resonant circuit. Inductor 11 includes an input terminal 26 and output terminal 27. Structure 15 further includes an inductor 12 in parallel with floating capacitors 18 and 19. Inductor 12 includes an input terminal 29, which is a common connection with output terminal 27, and an output terminal 28. A first TVS device 337 is connected between input terminal 26 and a common return terminal 109. A second TVS device 338 is connected between input terminal 29 and common return terminal 109, and third TVS device 339 is connected between output terminal 28 and common return terminal 109.

In accordance with the present invention, floating capacitor 17 comprises, for example, a first MOS capacitor, and is combined or integrated with TVS device 337 into a single device or device 46. Floating capacitor 18 comprises, for example, a second MOS capacitor, and is combined or integrated with TVS device 338 into a single device or device 43.

Floating capacitor 19 comprises, for example, a third MOS capacitor, and is combined or integrated with TVS device 339 into a single device or device 44. The capacitances of these devices are adjusted according to the output requirements or specifications of filter or structure 15.

Figure 3:
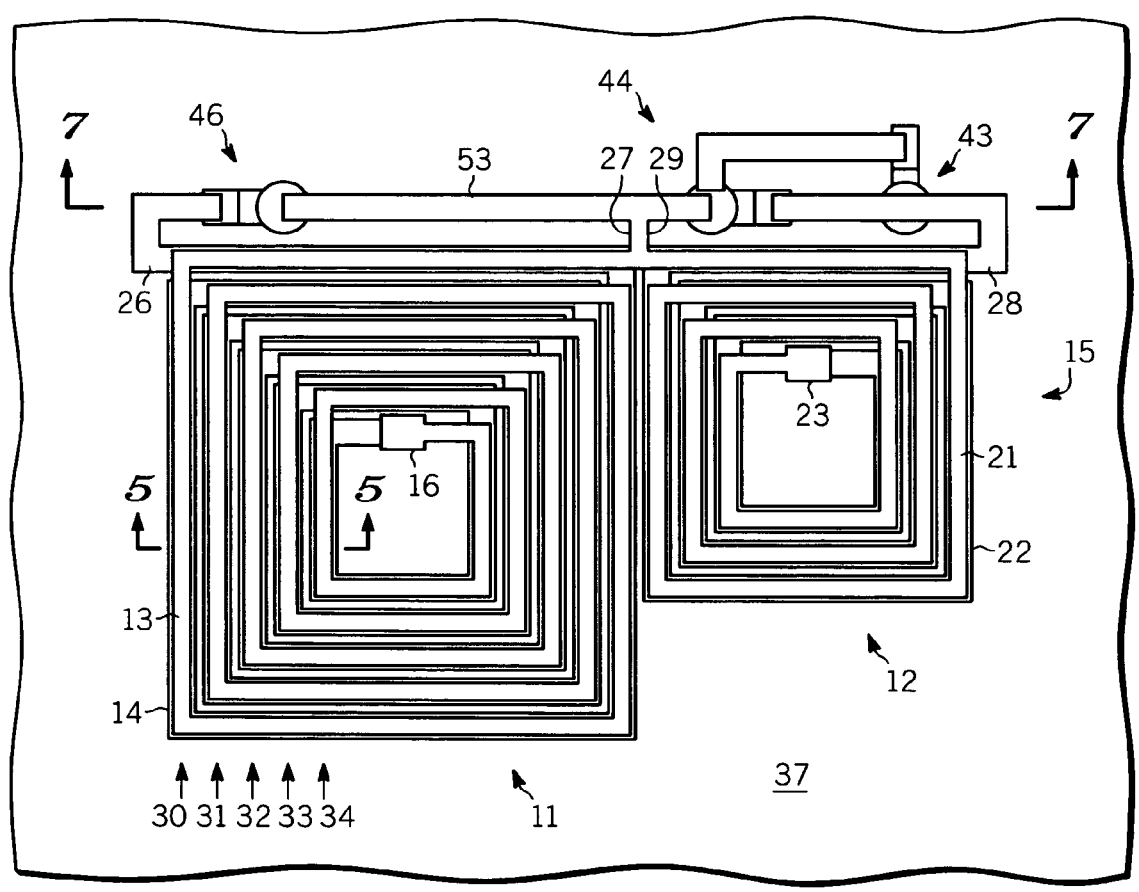
FIG. 3 illustrates an enlarged plan view of a portion of a structure including an implementation of the filter circuit of FIG. 2 in accordance with the present invention.
Figure 4:
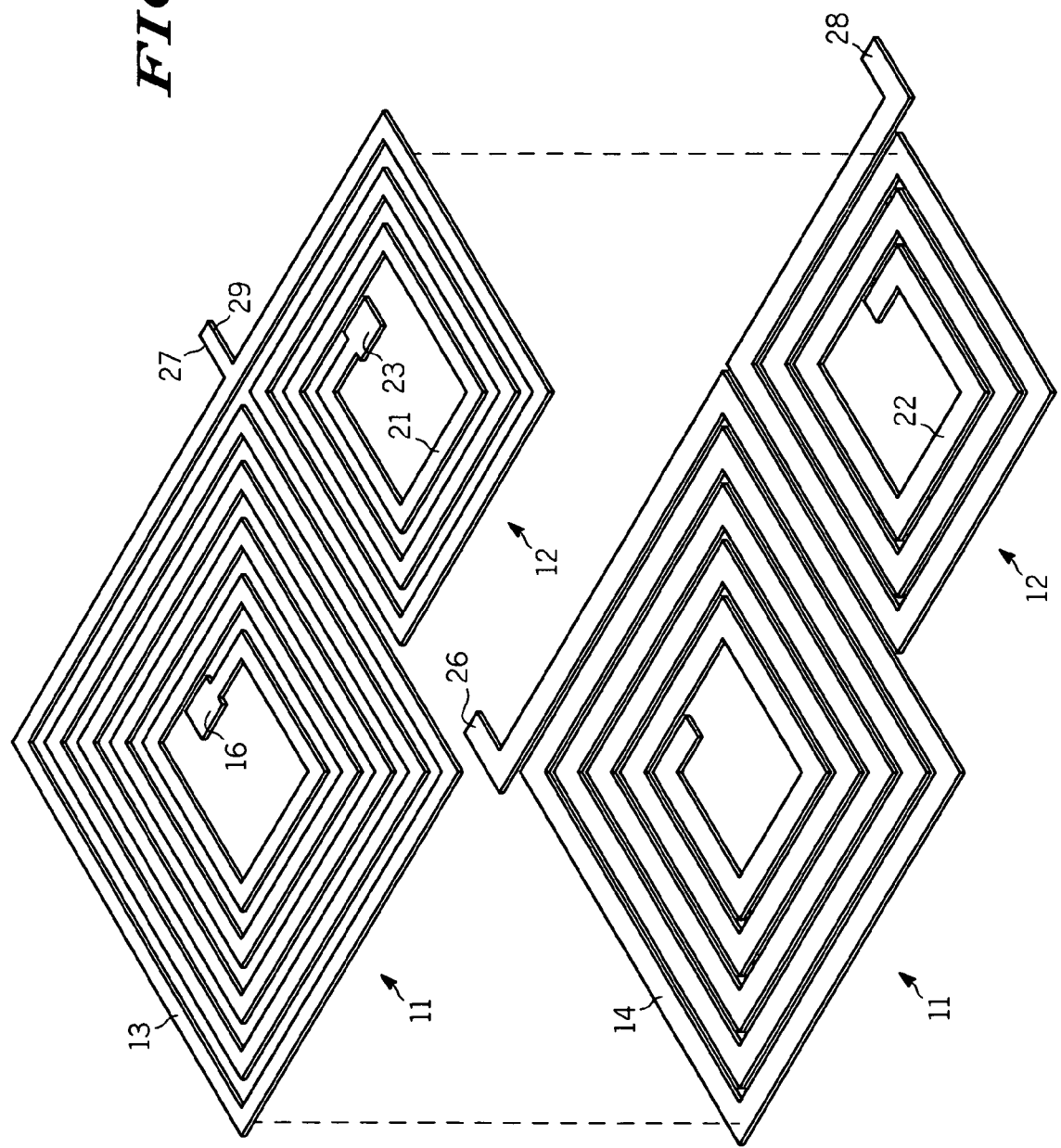
FIG. 4 illustrates an enlarged exploded view of a portion of the device of FIG. 3.
Figure 5:
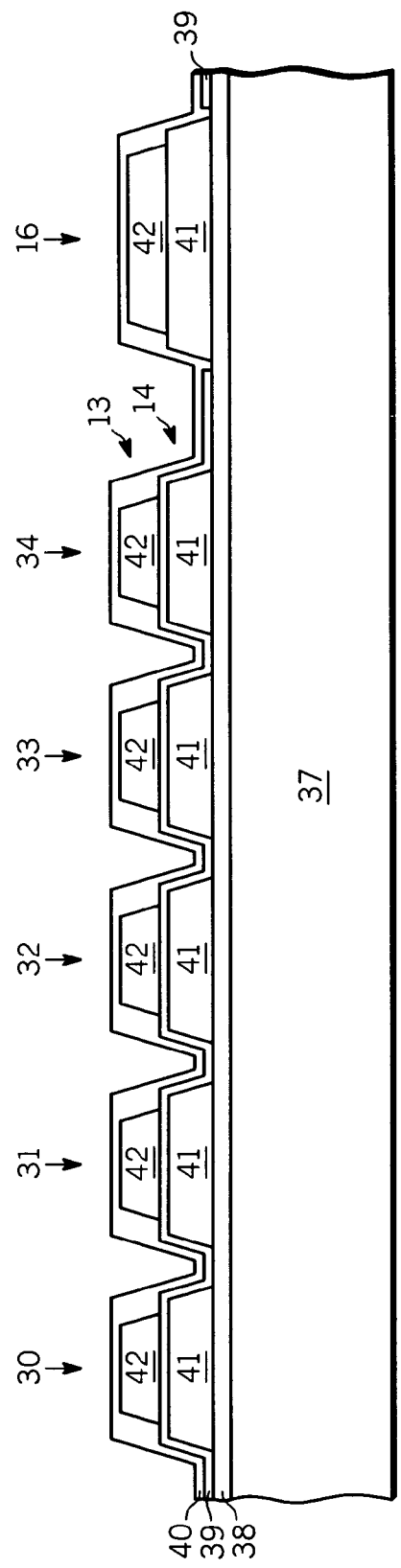
FIG. 5 illustrates an enlarged cross-sectional view of a portion of the device of FIG. 3 taken along reference line 5-5.

The following description has reference to FIG. 3, FIG. 4 and FIG. 5. FIG. 3 illustrates an enlarged plan view of a portion of an embodiment of a semiconductor device 10 that includes structure 15 of FIG. 2 in accordance with the present invention. Structure 15 is identified in a general manner by an arrow. Devices 43, 44, and 46 are shown connected to inductors 11 and 12. In this embodiment, inductors 11 and 12 comprise stacked or multi-layer structures. As will be understood by those skilled in the art, integrated semiconductor inductors such as inductor 11 or inductor 12 or the combination thereof may be used to form several types of filters including Bessel, band pass, Chebyschev, and/or elliptic filters. It is further understood that inductors 11 and 12 may comprise single layer inductors. FIG. 4 illustrates an enlarged exploded view of a portion of inductor structures 11 and 12 of FIG. 3. FIG. 5 illustrates, in a general way, an enlarged cross-sectional view of a portion of first stacked inductor 11 taken along reference line 5-5 of FIG. 3. The cross-section of FIG. 5 is illustrated to cut through legs 30, 31, 32, 33, and 34 of inductor 11 shown in FIG. 3.

Inductor 11 is formed to include a first inductor element 14 and a second inductor element 13. First inductor element 14 is formed to overlie a first portion of a surface of substrate 37 and second inductor element 13 is formed overlying element 14. Element 14 is formed in a pattern that provides electro-magnetic coupling between adjacent portions of element 14 in order to provide element 14 an inductance that is greater than the inductance of a straight line conductor. Element 13 is formed in a similar pattern overlying element 14 such that the pattern of element 13 provides electro-magnetic coupling between adjacent portions of element 13 in order to provide element 13 an inductance that is greater than the inductance of a straight line conductor. Further, elements 13 and 14 are magnetically coupled to each other.

Additionally the pattern and the overlying proximity of elements 14 and 13 provide electro-magnetic coupling between elements 13 and 14 such that elements 13 and 14 form an inductance for inductor 11 that is greater than the sum of the separate inductance of element 13 plus the separate inductance of element 14. Typically, adjacent portions of element 14 are about one to six (1-6) microns apart and adjacent portions of element 13 are about one to ten (1-10) microns apart. Element 13 typically is about one-half to two (0.5-2) microns from element 14 in order to ensure that there is sufficient coupling therebetween. One end or terminal of element 13 is electrically connected to one end or terminal of element 14 at a node 16 in order to provide an electrical connection between elements 13 and 14. A second terminal of element 14 functions as terminal 26 of inductor 11 and a second terminal of element 13 functions as terminal 27 of inductor 11.

Inductor 12 is formed to include a first inductor element 22 and a second inductor element 21. First inductor element 22 is formed to overlie a second portion of the surface of substrate 37 and second inductor element 21 is formed overlying element 22. Element 22 is formed in a pattern that provides electro-magnetic coupling between adjacent portions of element 22 in order to provide element 22 an inductance that is greater than the inductance of a straight line conductor. Element 21 is formed in a similar pattern overlying element 22 such that the pattern of element 21 provides electro-magnetic coupling between adjacent portions of element 21 in order to provide element 21 an inductance that is greater than the inductance of a straight line conductor. Additionally the pattern and the overlying proximity of elements 22 and 21 provide electro-magnetic coupling between elements 22 and 21 such that elements 22 and 21 form an inductance for inductor 12 that is greater than the sum of the separate inductance of element 21 plus the separate inductance of element 22. One end or terminal of element 21 is electrically connected to one end or terminal of element 22 at a node 23 in order to provide an electrical connection between elements 22 and 21. A second terminal of element 22 functions as terminal 28 of inductor 12 and a second terminal of element 21 functions as terminal 29 of inductor 12.

In one embodiment, elements 13 and 14 are formed in the shape of a square spiral. However, each of elements 13 and 14 may be formed in other shapes that provide mutual magnetic flux coupling between adjacent portions of element 13 and that provides mutual flux coupling between adjacent portions of element 14, and between elements 13 and 14. For example, elements 13 and 14 may be formed in a circular spiral, or an elongated spiral, or any well known shapes that provide magnetic flux coupling. In this preferred embodiment, element 14 begins at node 26 and extends in a clockwise direction above the surface of substrate 37 until terminating in terminal 26. Element 13 begins at node 16 and extends in a clockwise direction overlying portions of element 14 that have substantially the same radius as the corresponding portion of element 13 until terminating at terminal 27. Inductor 12 is formed similarly to inductor 11. Element 22 begins at node 23 and extends in a clockwise direction above the surface of substrate 37 until terminating at terminal 28. Element 21 begins at node 29 and extends in a clockwise direction overlying similar portions of element 22 until terminating at terminal 23. The exploded view in FIG. 4 assists in illustrating the overlying relationships between elements 13 and 14 and elements 21 and 22.

Referring to FIG. 3 and FIG. 5, element 14 typically includes a conductor 41 and an overlying dielectric 39. Element 13 typically includes a conductor 42 and an overlying dielectric 40. Typically, conductors 41 and 42 are formed from low resistance conductor materials such as metals in order to minimize the series resistance. The material used for conductors 41 and 42 typically has a resistivity that is no greater than about four to five (4-5) micro ohm-cm. Elements 13 and 14 typically are formed overlying the first portion of substrate 37. A dielectric 38 typically is formed on a surface of substrate 37 in order to electrically insulate inductor 11 from substrate 37. Conductor 41 is formed on the surface of dielectric 38 in the desired pattern of element 14. For example, a mask may be applied to dielectric 38 and patterned to expose the portions of dielectric 38 where conductor 41 is to be formed. Alternatively, a layer of conductive material is deposited overlying dielectric layer 38, and subsequently patterned using conventional photolithographic and etc techniques to form conductor 41. Thereafter, dielectric 39 is formed overlying conductor 41. Dielectric 39 may not be formed on the portion of conductor 41 where node 16 is formed. Conductor 42 is formed on the surface of dielectric 39 that is overlying the top surface of conductor 41. Conductor 42 is also formed on the surface of conductor 41 where node 16 is formed. A dielectric 40 optionally is applied to cover conductor 42 to electrically insulate conductor 42 from other elements of device 10.

Inductor 12 is formed in a manner similar to inductor 11. Element 22 includes a conductor similar to conductor 41 and an overlying dielectric similar to dielectric 39. Element 21 includes a conductor similar to conductor 42 and overlying dielectric similar to dielectric 40. Node 23 is formed in a manner similar to node 16.

Figure 6:
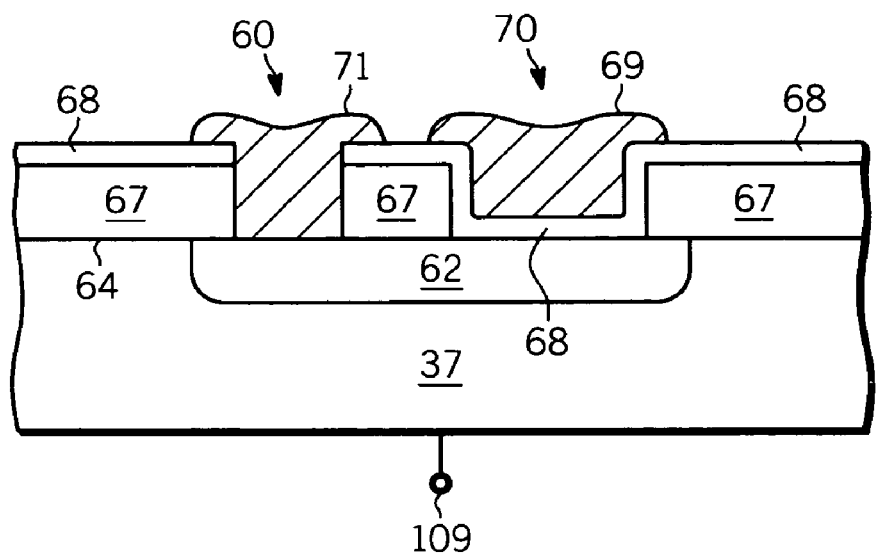
FIG. 6 illustrates an enlarged partial cross-sectional view of an embodiment of a device in accordance with the present invention.

FIG. 6 shows a highly enlarged partial cross-sectional view of an integrated linear (i.e., voltage independent) floating capacitor or MOS capacitor structure or capacitor/TVS structure or device 61 suitable for use as device 43, 44, and/or 46 in structure 15 in accordance with a first embodiment of the present invention. Device 61 comprises semiconductor substrate or region 37, which is, for example a <100> p-type conductivity substrate having a dopant concentration on the order of about $1.0 \times 10^{19}$ atoms/cm$^3$. In one embodiment, substrate 37 comprises silicon. Alternatively, substrate 37 comprises other semiconductor materials such IV-IV or III-V materials. Additionally, it is understood that the term semiconductor substrate means a region of semiconductor material, and this can include a semiconductor wafer, a region of semiconductor material formed within a semiconductor wafer, a layer of semiconductor material formed overlying a semiconductor wafer, or a layer of semiconductor material formed overlying an insulative layer or insulative material.

A well, doped, or diffused region 62 is formed in region 37 and extends from a major surface 64. In this embodiment, well region 62 has n-type conductivity and a dopant concentration on the order of about $1.0 \times 10^{20}$ atoms/cm$^3$. The concentration of well region 62 is selected so that the threshold voltage VT of the capacitor is high and negative, and the capacitance characteristic is substantially constant within a desired operating voltage range. For example, a high doping concentration (e.g., a surface concentration greater than about $1.0 \times 10^{19}$ atoms/cm$^3$) in well region 62 results in a constant capacitance/voltage characteristic for gate-to-well voltages in the range of 0 volts to 10 volts. In accordance with the present invention, well region 62 forms one plate of the capacitor element, and one electrode or junction of the TVS element.

An isolation or passivation layer 67 is formed overlying major surface 64 and well region 62, and comprises silicon dioxide, a deposited oxide, a nitride, a spin-on glass, combinations thereof, or the like. Openings 60 and 70 are formed in layer 67, and a passivating or capacitive layer 68 is formed in one opening, and comprises for example, an oxide. The thickness of layer 68 is selected according to desired capacitive/voltage characteristics of device 61. By way of example, layer 68 has a thickness from about 0.005 microns to about 0.05 microns when layer 68 comprises a silicon oxide. It is understood that layer 68 may comprise other materials such as silicon nitride, tantalum pentoxide, barium strontium titanate, titanium dioxide or combinations thereof including combinations with silicon oxide or the like.

A first contact or conductive layer 69 is formed through opening 70 overlying layer 68 to form a first capacitor plate, and a second contact or conductive layer 71 is formed through opening 60 in contact with well region 62 as shown. By way of example, contacts 59 and 71 comprise a metal, a doped polycrystalline semiconductor material, combinations thereof, or the like. In this embodiment, well region 62 forms the second capacitor plate. Device 61 is referred to as floating because both contacts 69 and 71 are isolated from ground or substrate 37 by the pn junction formed between well region 62 and substrate 37. This supports certain filter or circuit designs such as elliptic filters.

Device 61 is referred to as integrated because it is a single device that functions both as a capacitive or floating capacitor element and a transient voltage suppression (TVS) element. That is, one plate of the floating capacitor is integral with a portion of the TVS device. In device 61, the MOS capacitor formed by contact 69, layer 68, and well region 62 provides the floating capacitive element (e.g., capacitors 17, 18, and/or 19 of FIG. 2) for devices 43, 44, and/or 46, and the pn junction formed between well region 62 and substrate 37 provides the TVS element (e.g., diodes 337, 338, and/or 339 of FIG. 2) for devices 43, 44, and/or 46. In accordance with the present invention, because device 61 is integrated, it has for example, lower resistance compared to the non-integrated devices of the prior art.

As is evident from FIG. 6, the area of the pn junction formed between well region 62 and substrate 37 in this embodiment is greater than the area of the MOS capacitor formed by contact 69, layer 68, and overlapping portion of well region 62. This is because well region 62 completely surrounds the MOS capacitor structure (i.e., is continuous without breaks beneath layer 68), and a portion of well region 62 provides for a top side contact with contact 71, which forms the bottom electrode for the capacitor. The interdependence of the MOS capacitor and the pn junction diode areas allows for the integration or combination of the two components or devices to support applications such as elliptic filters.

Figure 7:
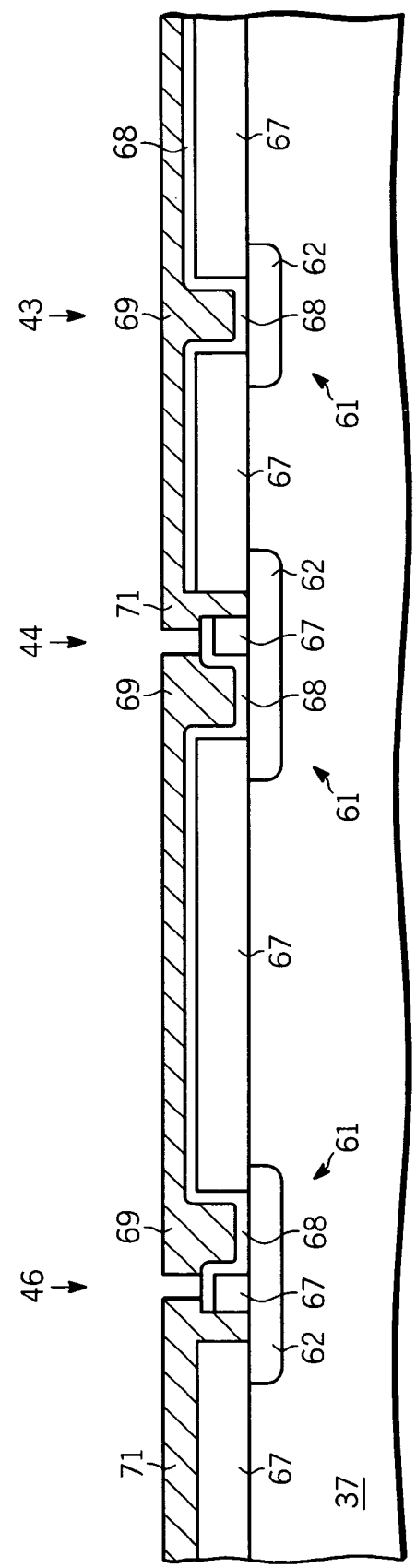
FIG. 7 illustrates an enlarged partial cross-sectional view of portion of the device of FIG. 3 taken along reference line 7-7.

FIG. 7 shows a highly enlarged partial cross-sectional view of device 10 of FIG. 3 taken along reference line 7-7 in accordance with the present invention. In this partial cross-section, devices 46, 44 and 43 are shown in the implementation of structure 15 of FIG. 3 as integrated devices 61 of FIG. 6.

Figure 8:
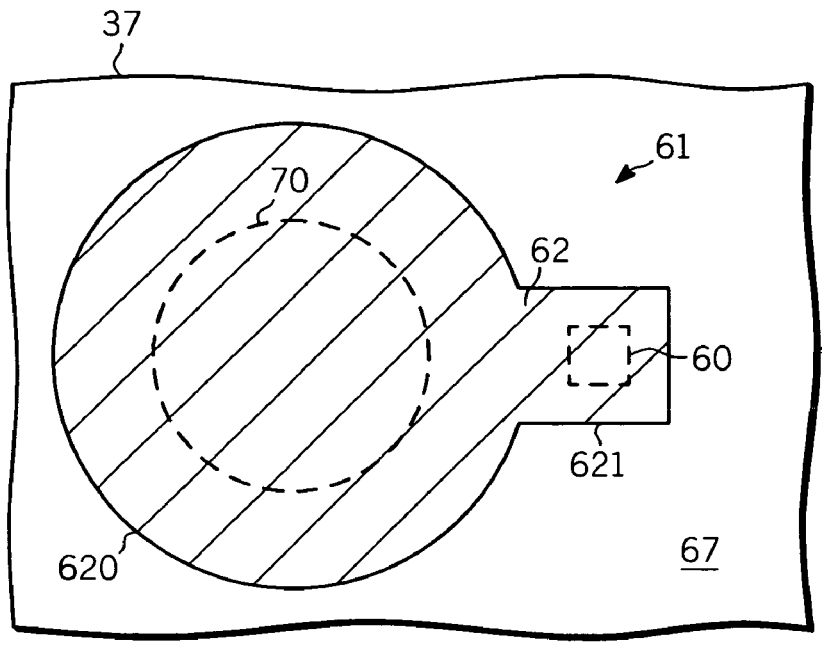
FIG. 8 illustrates an enlarged plan view of an embodiment of the device of FIG. 6 in accordance with the present invention.

FIG. 8 shows a partial top plan view of an embodiment of device 61 in accordance with the present invention. In this embodiment, well region 62 is lightly shaded to show that it is a continuous region within substrate 37 as described in conjunction with FIG. 6. In this embodiment, well region 62 comprises a circular portion 620 for defining the MOS capacitor element of device 61, and a rectangular like portion 621, which provides a convenient structure for electrode 71 (shown in FIG. 6) to make contact to well region 62 through opening 60 in layer 67. An example of opening 70 in layer 67 is shown for further defining the MOS capacitive element of device 61. It is understood that portions 620 and 621 of well region 62 may comprise other shapes including square, polygonal, circular, triangular, combinations thereof, or the like. Additionally, portion 621 may have rounded corners. Moreover, it is understood that the shape of opening 60 may include other shapes including circular, square, rectangular, triangular, combinations thereof, or the like.

Turning now to FIGS. 9 to 15, a method of manufacturing device 61 with other electrical components on a semiconductor substrate is now described. It is understood, that all or a portion of the other electrical components described below may be integrated with device 61. It is understood that conductivity types are chosen for illustrative purposes only, and the conductivity types may be, for example, reversed in other embodiments of the present invention.

Figure 9:
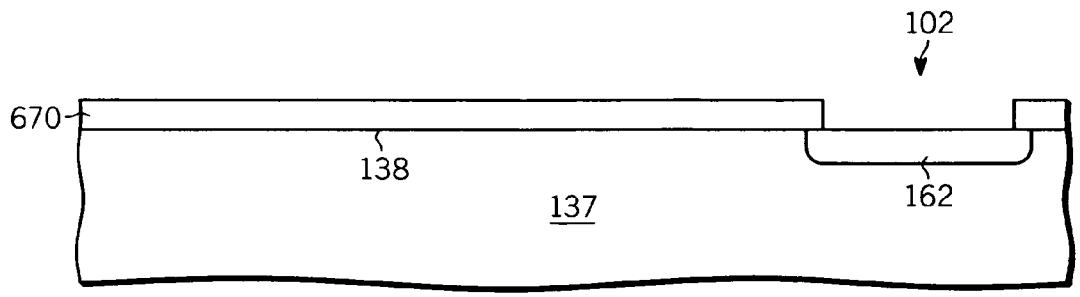
FIGS. 9-14 illustrate enlarged partial cross-sectional views of an integrated device in accordance with the present invention as various stages of fabrication.

FIG. 9 shows a highly enlarged partial cross-sectional view of integrated device 100 at an early stage of fabrication. Device 100 includes a semiconductor substrate 137, which comprises for example, a <100> p-type silicon substrate having a dopant concentration on the order of about $1.0 \times 10^{19}$ atoms/cm$^3$. Substrate 137 may comprise other semiconductor materials such as IV-IV or III-V semiconductor materials.

A first passivation layer 670 is formed overlying a major surface 138 of substrate 137. By way of example, layer 670 comprises a thermally grown silicon oxide layer having a thickness of about 0.7 microns to about 1.0 microns. Next an opening 102 is formed in layer 670 using conventional photolithographic and etch techniques. An n-type dopant is then incorporated into substrate 137 through opening 102 to form well region 162. By way of example, well region 162 is formed using ion implantation, spin-on doping, or chemical vapor deposition techniques. In one embodiment, well region 162 is formed using phosphorous chemical vapor deposition techniques, and has a surface concentration on the order of $1.0 \times 10^{20}$ atoms/cm$^3$ and depth on the order of 1-2 microns. It is understood that the doping profile of well region 162 is variable depending on the desired capacitance and breakdown voltage characteristics for the MOS Capacitor/TVS device combination. It is further understood that well region 162 may be formed using photomasked ion implantation as opposed to the hard mask approach described above.

Figure 10:
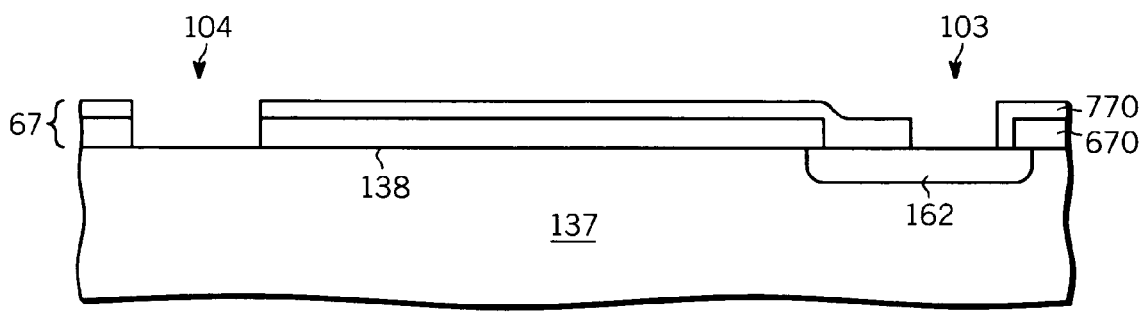

FIG. 10 shows a highly enlarged partial cross-sectional view of integrated device 100 at a subsequent step of fabrication. After a conventional cleaning step, a second passivation layer 770 is formed overlying layer 670 and within opening 102. By way of example, layer 770 comprises a thermally grown silicon oxide layer having a thickness of about 0.7 microns to about 1.0 microns. When layer 770 comprises a thermal oxide, its thickness is thinner over layer 670 than it is within opening 102 as shown in FIG. 10 because of the growth dynamics of thermal oxides. When layer 770 comprises a deposited film, its thickness is more uniform. In one embodiment, layers 670 and 770 together form passivation layer 67 as shown in FIG. 6. Next openings 103 and 104 are formed in layers 770 and 670 using conventional photolithographic and etch techniques.

Figure 11:
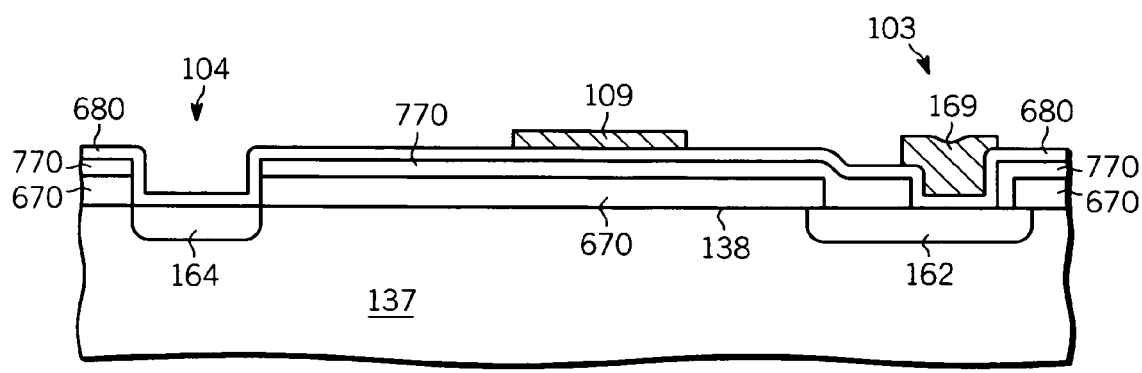

FIG. 11 shows a highly enlarged partial cross-sectional view of integrated device 100 at a subsequent step of fabrication. A passivating or capacitive layer 680 is formed overlying major surface 138 and layers 770 and 670. By way of example, layer 680 comprises a dry silicon oxide layer and has a thickness from about 0.005 microns to about 0.05 microns. Next, a conductive layer or polycrystalline semiconductor layer is formed overlying layer 680. By way of example, the polycrystalline semiconductor layer comprises a polysilicon that is either doped in-situ, or subsequently doped using, for example, ion implantation. A conventional photolithography and etch step is used to pattern the polycrystalline semiconductor layer to form, for example, a resistor layer 109, and a first contact layer 169. In an embodiment where subsequently doped (i.e., not doped in-situ) polysilicon is used, the doping step occurs in one embodiment after layers 109 and 169 are patterned. In an alternative embodiment, the layer is doped prior to the photolithography and etch step. An n-type doped region 164 is then formed through opening 104 and extends from major surface 138 into substrate 137. By way of example, region 164 is formed using ion implantation and anneal/diffusion techniques. In one embodiment, region 164 forms a pn junction device for use as a low leakage Zener diode.

Figure 12:
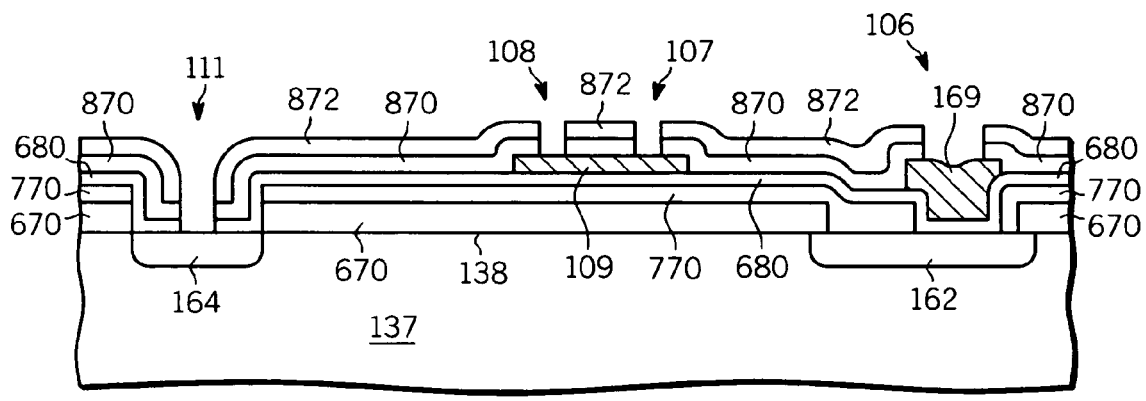

FIG. 12 shows a highly enlarged partial cross-sectional view of integrated device 100 at a further step of fabrication. A third passivation layer 870 is formed overlying device 100, and comprises for example, a deposited oxide. In one embodiment, layer 870 comprises a deposited oxide formed using a tetraethylorthosilicate source, and has a thickness from about 0.4 microns to about 0.7 microns. In one embodiment when region 164 is doped using ion implantation techniques, region 164 is annealed after layer 870 is formed. A protective or masking layer 872 is then formed overlying layer 870. By way of example, layer 872 comprises a photoresist layer or a hard mask layer. Next, opening 106 is formed above contact 169, openings 107 and 108 are formed above resistor layer 109, and opening 111 is formed above region 164 using conventional etching techniques.

Figure 13:
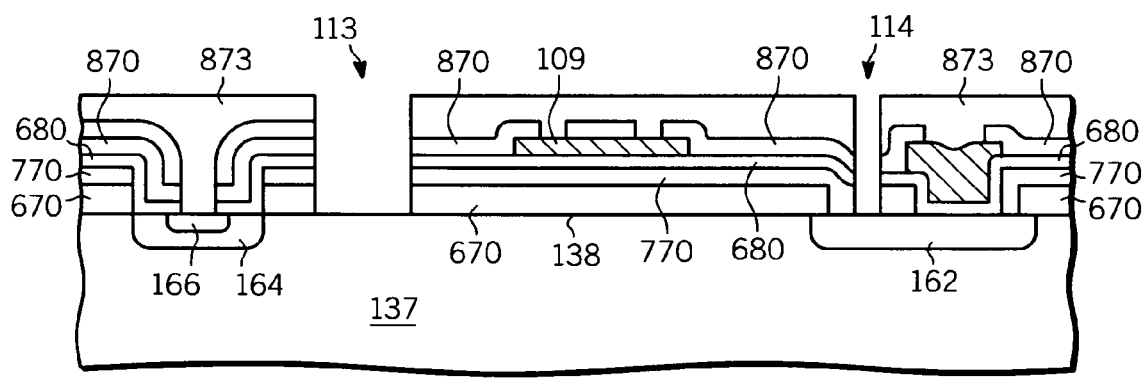

FIG. 13 shows a highly enlarged partial cross-sectional view of integrated device 100 at a still further step of fabrication. After masking layer 872 is removed, major surface 138 within region 164 is doped with additional n-type dopant to form contact region 166. Next, a protective or masking layer 873 is formed overlying device 100. By way of example, layer 873 comprises a photoresist layer or a hard mask layer. Next, an opening 113 is formed overlying a portion of substrate 137, and an opening 114 is formed above a portion of well region 162 using conventional etching techniques.

Figure 14:
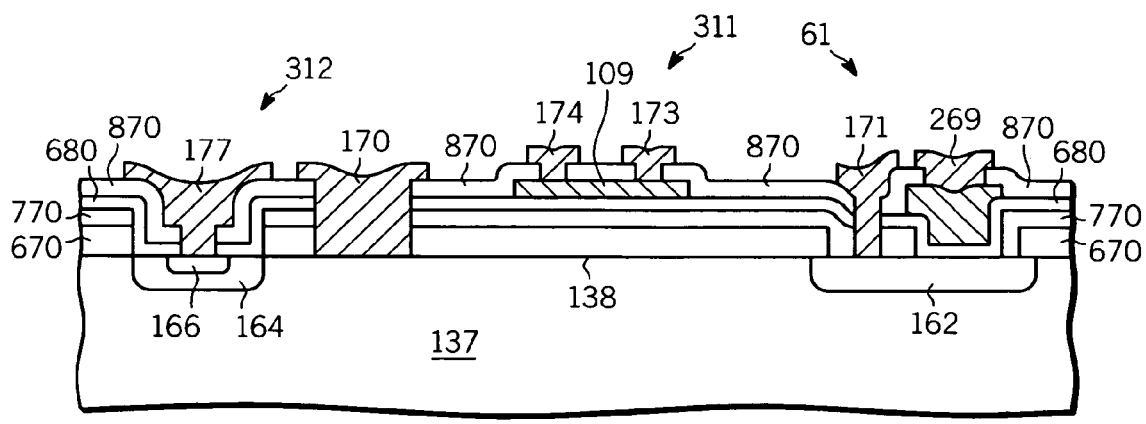

FIG. 14 shows a highly enlarged partial cross-sectional view of integrated circuit device 100 at a later step of fabrication. A conductive layer is formed overlying device 100. By way of example, the conductive layer comprises a metal or a doped polycrystalline semiconductor material. In one embodiment, the conductive layer comprises aluminum or an aluminum alloy (e.g., AlSi), and has a thickness of about 2.0 microns. The conductive layer is then patterned using conventional photolithographic and etch techniques to form contact 171 coupled to well region 162, contact 269 above contact 169, resistor contacts 173 and 174 coupled to resistor layer 109, substrate or ground contact 176 coupled to substrate 137, and contact 177 coupled to regions 166 and 164. As shown in the embodiment of FIG. 14, device 100 includes an integrated floating capacitor/TVS device structure 61 in accordance with the present invention conveniently integrated with a resistor structure 311, a diode structure 312, and a ground contact 170.

Figure 15:
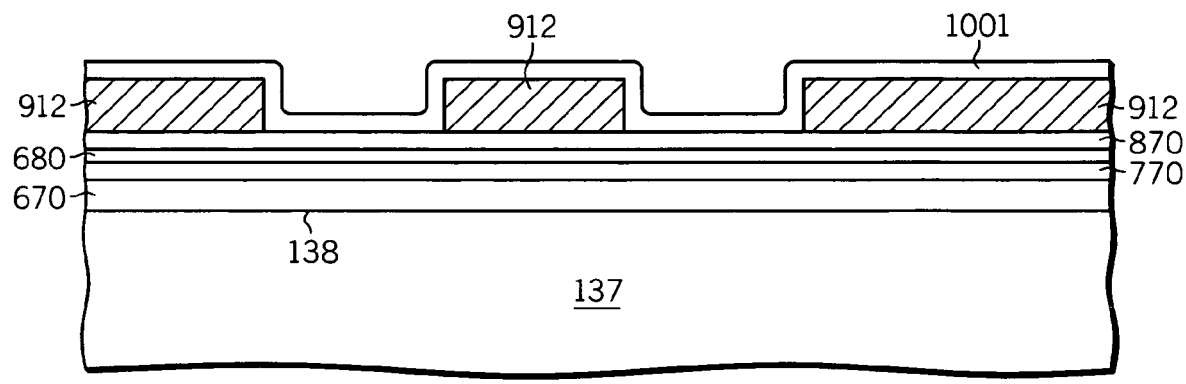
FIG. 15 illustrates an enlarged partial cross-section view of another portion of the integrated device of FIGS. 9-14.

FIG. 15 shows a highly enlarged partial cross-sectional view of another portion of device 100 after further processing. One or more conductive layers are formed overlying device 100 and patterned to form an inductor structure 912. In one embodiment, inductor structure 912 is configured similarly to inductors 11 or 12 as described in conjunction with FIG. 4. In one embodiment, inductor structure 912 comprises copper formed using for example, electroplating or other deposition techniques. In another embodiment, a final passivation layer 1001 is formed overlying the inductor structure 912 and layer 970. By way of example, layer 1001 comprises a dielectric material. In an alternative embodiment, inductors 11 and/or 12 of FIGS. 4 and 5 are conveniently integrated with device 100 with dielectric layer 38 being substituted for example, with layer 870.

Figure 16:
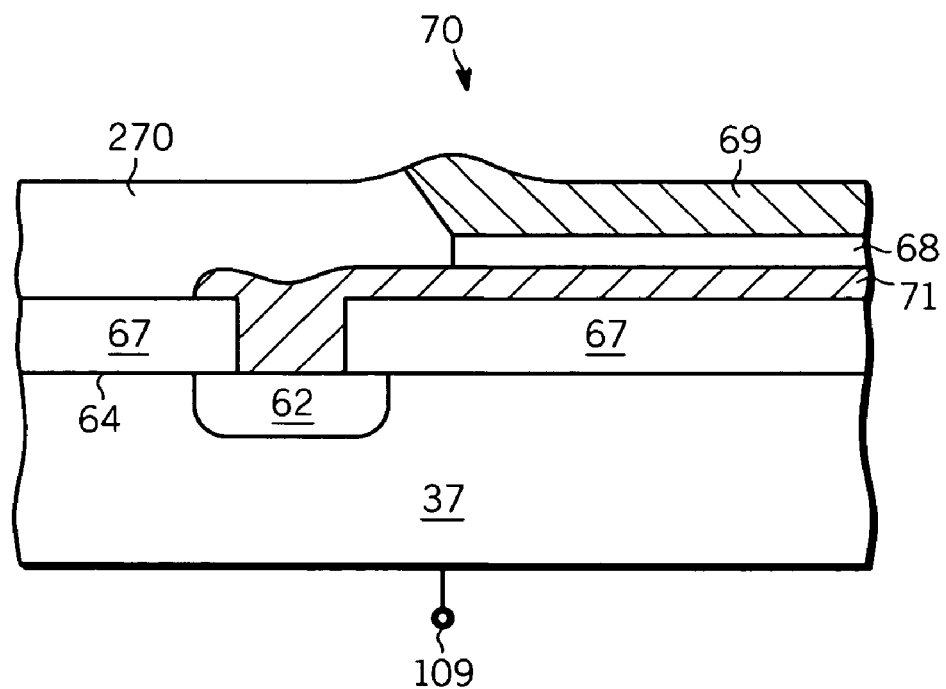
FIG. 16 illustrates an enlarged partial cross-sectional view of another embodiment of a device in accordance with the present invention.

FIG. 16 shows a highly enlarged partial cross-sectional view of another embodiment of an integrated capacitor or floating capacitor/TVS structure or device 261 in accordance with the present invention. In this embodiment, one plate of the floating capacitor is integral with a doped region of the TVS device. For example, device 261 comprises a metal-insulator-metal or MIM device integrated with a TVS diode device. Conductive layer 71 is formed overlying layer 67 and is coupled between n-type well region 62, which forms a pn junction with substrate 37, and capacitive layer 68, which overlies a portion of conductive layer 71. Although conductive layer 71 is shown as a single layer of material, it is understood that conductive layer 71 may comprises a combination of multiple layers of conductive material, and may further include vias interconnecting the various conductive layers to well region 62. A second passivation layer 270 is then formed overlying layer 67 and conductive layer 71. By way of example, layer 270 comprises a deposited oxide having a thickness from about 1.0 microns to about 6.0 microns. Layer 270 is then patterned to expose a portion of conductive layer 71. Insulative, passivation or capacitive layer 68 is then formed overlying conductive layer 71, and conductive layer 69 is then formed overlying passivation layer 68. Conductive layer 69 forms one conductive plate of the capacitive element of device 261 and conductive layer 71 forms the other plate of the capacitive element. In this embodiment, the conductive layer 71 is coupled between capacitive layer 68 and well region 62, and is common with an electrode of the TVS element of device 261, which includes substrate 37 and well region 62.

Figure 17:
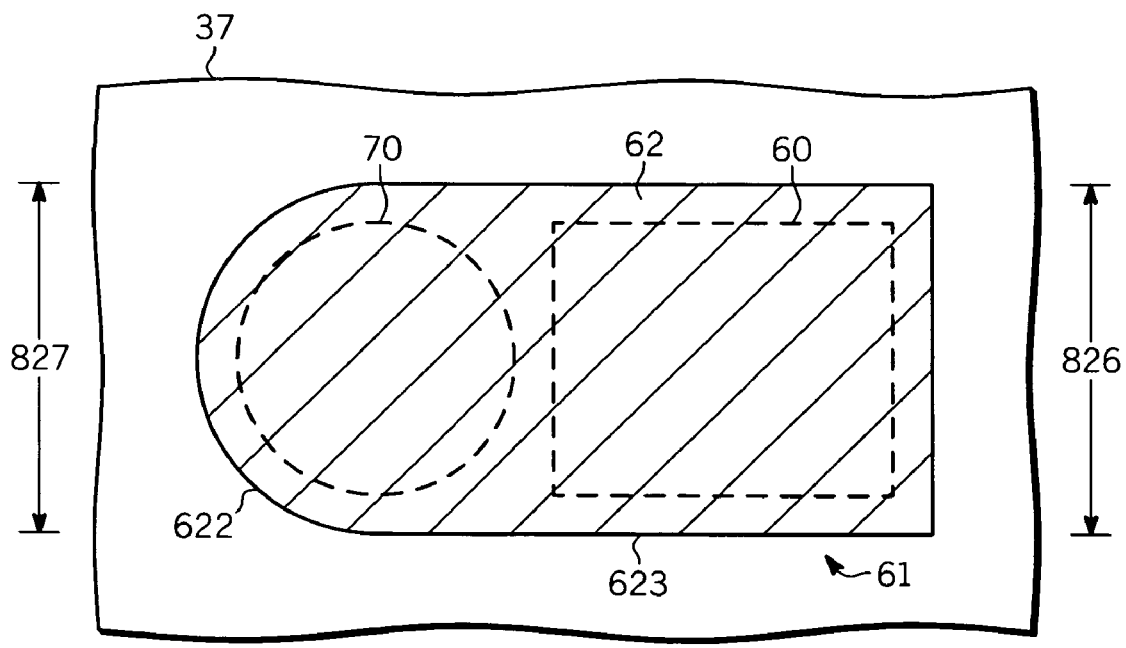
FIGS. 17-19 illustrate enlarged plan view of various embodiments of the device of FIG. 6 in accordance with further embodiments of the present invention.

FIG. 17 shows a plan view of a further embodiment of device 61 in accordance with the present invention. In this embodiment well region 62 is shaped to include a rectangular portion 623 and a semi-circular portion 622. Semi-circular portion 622 has a diameter 827 that is equal to height 826 of rectangular portion 726. Openings 60 and 70 as described in FIGS. 6 and 8 are also shown. It is understood that the shape of opening 60 may include other shapes including circular, rectangular, triangular, combinations thereof, or the like.

Figure 18:
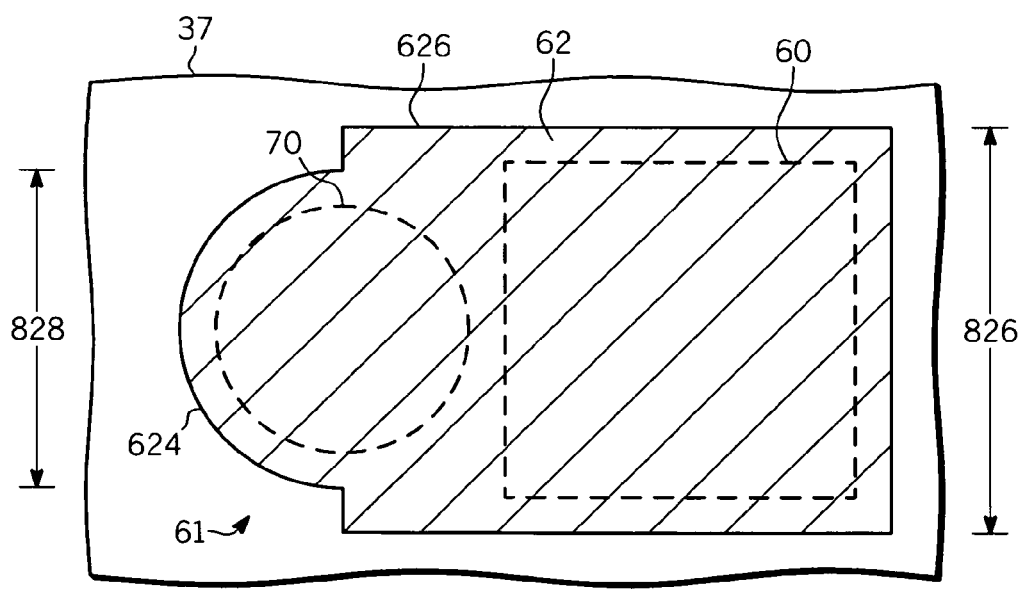

FIG. 18 shows a plan view of a still further embodiment of device 61 in accordance with the present invention. In this embodiment, well region 62 is shaped to include a rectangular portion 626 and a semi-circular portion 624. Semi-circular portion 624 has a diameter 828 that is less than height 826 of rectangular portion 626. That is, semi-circular portion 624 is offset in or set in with respect to rectangular portion 626. Openings 60 and 70 as described in FIGS. 6 and 8 are also shown. It is understood that the shape of opening 60 may include other shapes including circular, rectangular, triangular, combinations thereof, or the like.

Figure 19:
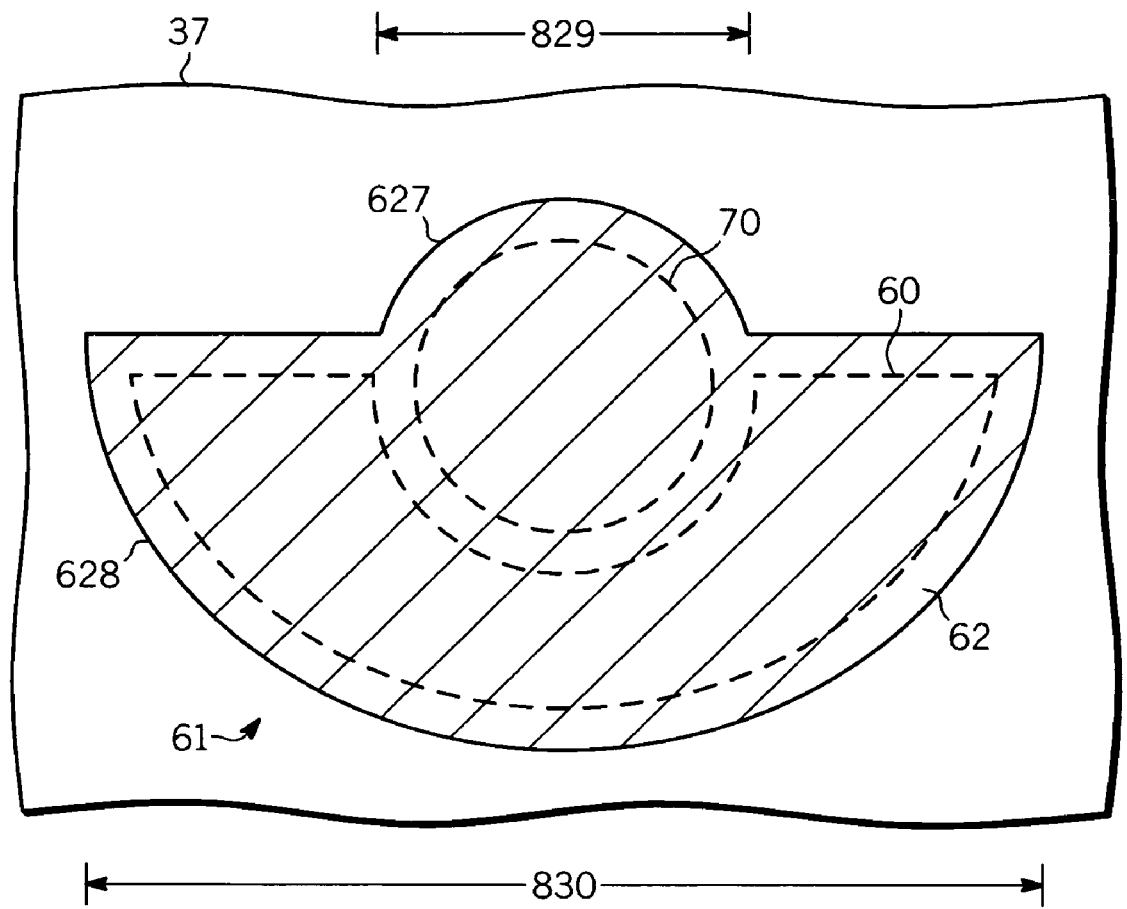

FIG. 19 shows a plan view of an additional embodiment of device 61 in accordance with the present invention. In this embodiment, well region 62 is shaped to include first and second opposing semi-circular portions 627 and 628. Semi-circular portion 627 has a diameter 829 that is smaller than diameter 830 of semi-circular portion 628. That is, semi-circular portion 627 is offset in or set-in with respect to semi-circular portion 628. Openings 60 and 70 as described in FIGS. 6 and 8 are also shown. It is understood that the shape of opening 60 may include other shapes including circular, square, rectangular, triangular, combinations thereof, or the like.

In view of all the above, it is evident that an integrated floating capacitor/TVS device structure and a method of manufacture has been provided. The structure saves on space, is conveniently integrated with other device components when forming resonant structures such as elliptic filters, and provides performance characteristics equal or better than prior art filter designs.

Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A semiconductor filter structure comprising:
a semiconductor substrate of a first conductivity type and having a first major surface and a second major surface opposite to the first major surface;
a first doped region of a second conductivity type formed in the semiconductor substrate;
a first dielectric layer formed overlying a portion of the first doped region, wherein the first doped region is continuous adjacent to the first dielectric layer;
a second doped region of the second conductivity type formed in the semiconductor substrate;
a second dielectric layer formed overlying a portion of the second doped region, wherein the second doped region is continuous adjacent to the second dielectric layer;
a third doped region of the second conductivity type formed in the semiconductor substrate;
a third dielectric layer formed overlying a portion of the third doped region, wherein the third doped region is continuous adjacent to the third dielectric layer;
a first conductive electrode formed overlying the semiconductor substrate and coupled to the first doped region;
a second conductive electrode formed overlying the first dielectric layer and overlying the second dielectric layer; and
a third conductive electrode formed overlying the third dielectric layer and coupled to the second doped region, wherein the first doped region forms a first plate of a first capacitor and a first electrode of a first TVS device, and wherein the second doped region forms a first plate of a second capacitor and a first electrode of a second TVS device, and wherein the third doped region forms a first plate of a third capacitor and a first electrode of a third TVS device, and wherein the second major surface forms a second electrode for at least one of the first, second and third TVS devices.

2. The structure of claim 1, wherein the semiconductor substrate has a dopant concentration of about $1.0 \times 10^{19}$ atoms/cm$^3$.

3. The structure of claim 2, wherein the first, second, and third doped regions have dopant concentrations of about $1.0 \times 10^{20}$ atoms/cm$^3$.

4. The filter structure of claim 1 further comprising a first multilayer inductor overlying at least a portion of the semiconductor substrate, the first multilayer inductor having a first terminal and a second terminal, the first multilayer inductor also having a first conductor overlying the portion of the semiconductor substrate, a second conductor overlying at least a portion of the first conductor a first dielectric disposed between the first conductor and the second conductor, wherein the first terminal is coupled to the first conductive electrode and second terminal is coupled to the second conductive electrode.

5. The filter structure of claim 4 wherein the first conductor and the second conductor are metal conductors.

6. The filter structure of claim 4 further including a second multilayer inductor coupled to the first multilayer inductor and having a first terminal and a second terminal, wherein the first terminal of the second multilayer inductor is coupled to the third conductive electrode, and wherein the second terminal of the second multilayer inductor is coupled to the second conductive electrode.

* * * * *